(12) United States Patent
Ohmae et al.

(10) Patent No.: US 10,937,929 B2
(45) Date of Patent: Mar. 2, 2021

(54) SEMICONDUCTOR UNIT, SEMICONDUCTOR DEVICE, LIGHT-EMITTING APPARATUS, DISPLAY APPARATUS, AND METHOD OF MANUFACTURING SEMICONDUCTOR DEVICE

(71) Applicant: SONY CORPORATION, Tokyo (JP)

(72) Inventors: Akira Ohmae, Kanagawa (JP); Yusuke Kataoka, Kanagawa (JP); Tatsuo Ohashi, Kanagawa (JP); Ippei Nishinaka, Kanagawa (JP); Goshi Biwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/128,277

(22) PCT Filed: Mar. 2, 2015

(86) PCT No.: PCT/JP2015/001082
§ 371 (c)(1),
(2) Date: Sep. 22, 2016

(87) PCT Pub. No.: WO2015/151401
PCT Pub. Date: Oct. 8, 2015

(65) Prior Publication Data
US 2017/0098740 A1 Apr. 6, 2017

(30) Foreign Application Priority Data
Mar. 31, 2014 (JP) .............................. JP2014-071492

(51) Int. Cl.
*H01L 33/40* (2010.01)
*H01L 33/62* (2010.01)
(Continued)

(52) U.S. Cl.
CPC ............ *H01L 33/40* (2013.01); *F21V 23/003* (2013.01); *G06F 3/147* (2013.01);
(Continued)

(58) Field of Classification Search
USPC ........................................................ 362/231
See application file for complete search history.

(56) References Cited

U.S. PATENT DOCUMENTS

| | | | | |
|---|---|---|---|---|
| 6,222,722 B1* | 4/2001 | Fukuzumi | ............... | H01L 28/82 257/308 |
| 2007/0077673 A1* | 4/2007 | Hwang | ............... | H01L 33/0079 438/46 |
| 2012/0223345 A1* | 9/2012 | Tomoda | ............. | H01L 25/0753 257/89 |

FOREIGN PATENT DOCUMENTS

| | | |
|---|---|---|
| JP | 2001-358371 A | 12/2001 |
| JP | 2004-153110 A | 5/2004 |

(Continued)

*Primary Examiner* — Rafferty D Kelly
(74) *Attorney, Agent, or Firm* — Chip Law Group

(57) ABSTRACT

[Solving Means] A semiconductor unit includes a substrate, a semiconductor device, and a plating layer. The semiconductor device includes a semiconductor layer and one or more electrodes, the one or more electrodes being connected to the semiconductor layer and including a platinum-group element as a main material. The plating layer bonds the substrate and the electrode.

9 Claims, 14 Drawing Sheets

(51) Int. Cl.
 *F21V 23/00* (2015.01)
 *G06F 3/147* (2006.01)
 *H01L 25/075* (2006.01)
 *H01L 33/30* (2010.01)
 *H01L 33/32* (2010.01)

(52) U.S. Cl.
 CPC .......... *H01L 25/0753* (2013.01); *H01L 33/30* (2013.01); *H01L 33/32* (2013.01); *H01L 33/62* (2013.01); *H01L 2224/14* (2013.01); *H01L 2933/0016* (2013.01); *H01L 2933/0066* (2013.01)

(56) References Cited

FOREIGN PATENT DOCUMENTS

| | | | |
|---|---|---|---|
| JP | 2004-281432 | A | 10/2004 |
| JP | 2008-182050 | A | 8/2008 |
| JP | 2012-182276 | A | 9/2012 |

\* cited by examiner

SEMICONDUCTOR UNIT, SEMICONDUCTOR DEVICE, LIGHT-EMITTING APPARATUS, DISPLAY APPARATUS, AND METHOD OF MANUFACTURING SEMICONDUCTOR DEVICE

CROSS REFERENCE TO RELATED APPLICATIONS

This application is a U.S. National Phase of International Patent Application No. PCT/JP2015/001082 filed on Mar. 2, 2015, which claims priority benefit of Japanese Patent Application No. 2014-071492 filed in the Japan Patent Office on Mar. 31, 2014. Each of the above-referenced applications is hereby incorporated herein by reference in its entirety.

TECHNICAL FIELD

The present technology relates to a semiconductor device such as a light-emitting device, a semiconductor unit, a light-emitting apparatus, a display apparatus, and a method of manufacturing a semiconductor device.

BACKGROUND ART

In recent years, as lightweight and thin display apparatuses, LED displays that use light-emitting diodes (LEDs) for display pixels have received attention. The LED displays do not have viewing angle dependence in which contrast or color shade changes depending on a viewing angle, and have characteristics of a high reaction speed when a color is changed. A light-emitting device suitable for use in such LED displays is disclosed in, for example, Patent Document 1 (see, for example, Patent Document 1).
Patent Document 1: Japanese Patent Application Laid-open No. 2012-182276

SUMMARY OF INVENTION

Problem to be Solved by the Invention

Incidentally, high adhesiveness is demanded between a semiconductor device such as a light-emitting device and a substrate that mounts the semiconductor device.

It is an object of the present technology to provide a semiconductor unit in which adhesiveness between a semiconductor device and a substrate is increased, the semiconductor device, a light-emitting apparatus including them, a display apparatus, and a method of manufacturing a semiconductor device.

Means for Solving the Problem

In order to achieve the object described above, according to the present technology, there is provided a semiconductor unit including a substrate, a semiconductor device, and a plating layer.

The semiconductor device includes a semiconductor layer and one or more electrodes, the one or more electrodes being connected to the semiconductor layer and including a platinum-group element as a main material.

The plating layer bonds the substrate and the electrode.

The electrode including a platinum-group element as a main material is bonded to the plating layer on the substrate.

Thus, adhesiveness between the electrode and the plating layer is increased, and bonding strength thereof can be enhanced.

The semiconductor device may further include an insulation layer, the insulation layer being provided to come into contact with the semiconductor layer and including an aperture. The electrode may have a structure that is formed to come into contact with the insulation layer and to be connected to the semiconductor layer via the aperture.

As a result, electrodes having various shapes corresponding to the shape of the aperture of the insulation film are achieved.

The electrode the electrode may include an extension portion that extends outward from an end edge of the aperture, and the plating layer may be connected to at least the extension portion of the electrode.

In this case, a region of the electrode within the aperture may be filled with at least one of a resin and a cavity.

The plating layer may be further provided in a region of the electrode within the aperture.

As a result, since an adhesion area between the electrode and the plating layer is large, adhesiveness therebetween is increased.

The semiconductor layer may include an active layer, a first conductive type layer, and a second conductive type layer. The one or more electrodes may include a first electrode, the first electrode being connected to at least the first conductive type layer.

As a result, the light-emitting unit with increased adhesiveness and high reliability can be achieved as a semiconductor unit.

The one or more electrodes may further include a second electrode, the second electrode being connected to the second conductive type layer.

The insulation layer may include a surface that faces the substrate, and a ratio of an area of a bonding surface of the electrode and the plating layer to an area of the surface may be 50% or more and 85% or less.

According to the present technology, there is provided a semiconductor device including a semiconductor layer, one or more electrodes, and a plating layer.

The one or more electrodes are connected to the semiconductor layer and include a platinum-group element as a main material.

The plating layer is bonded to the electrode.

According to the present technology, there is provided a light-emitting apparatus including a light-emitting panel and a driver circuit that drives the light-emitting panel.

The light-emitting panel includes a substrate, light-emitting devices, and a plating layer.

The light-emitting devices each include a semiconductor layer and one or more electrodes, the one or more electrodes being connected to the semiconductor layer and including a platinum-group element as a main material.

The plating layer bonds the substrate and the electrodes of the light-emitting devices.

As a result, a light-emitting panel apparatus with increased adhesiveness and high reliability can be achieved.

According to the present technology, there is provided a display apparatus including light-emitting units and a driver circuit.

The light-emitting units each include light-emitting devices as one pixel and include light-emitting units on a pixel-by-pixel basis, the light-emitting devices emitting light of different wavelength ranges.

The driver circuit includes a substrate, a semiconductor device, and a plating layer.

The semiconductor device includes a semiconductor layer and one or more electrodes, the one or more electrodes being connected to the semiconductor layer and including a platinum-group element as a main material.

The plating layer bonds the substrate and the electrode.

As a result, the display apparatus with increased adhesiveness and high reliability can be achieved.

According to the present technology, there is provided a method of manufacturing a semiconductor unit, including exposing an electrode, the electrode being connected to a semiconductor layer and including a platinum-group element as a main material.

The exposed electrode faces a mount substrate.

The plating layer is formed between the electrode and the mount substrate.

Such a manufacturing method enables reduction in manufacturing processes and manufacturing costs, as compared with a method of manufacturing a semiconductor unit including an electrode made of a main material other than the platinum-group element.

Effects of the Invention

As described above, according to the present technology, adhesiveness between a substrate and a semiconductor device is increased.

It should be noted that effects described herein are not necessarily limited and any of the effects described in the present disclosure may be produced.

MODE(S) FOR CARRYING OUT THE INVENTION

Hereinafter, embodiments of the present technology will be described with reference to the drawings.

In the following description, when the drawings are referred to, terms such as "up, down, left, right, vertical, and horizontal" may be used in order to indicate directions or positions of the devices and apparatuses, but they are merely used for the purpose of description. In other words, those terms are used frequently for ease of comprehension, and may not coincide with the directions or positions in situations where the devices and apparatuses are actually manufactured or used.

1. Configuration Example 1 of Light-Emitting Unit

1) Configuration of Light-Emitting Unit

Figure 1A:
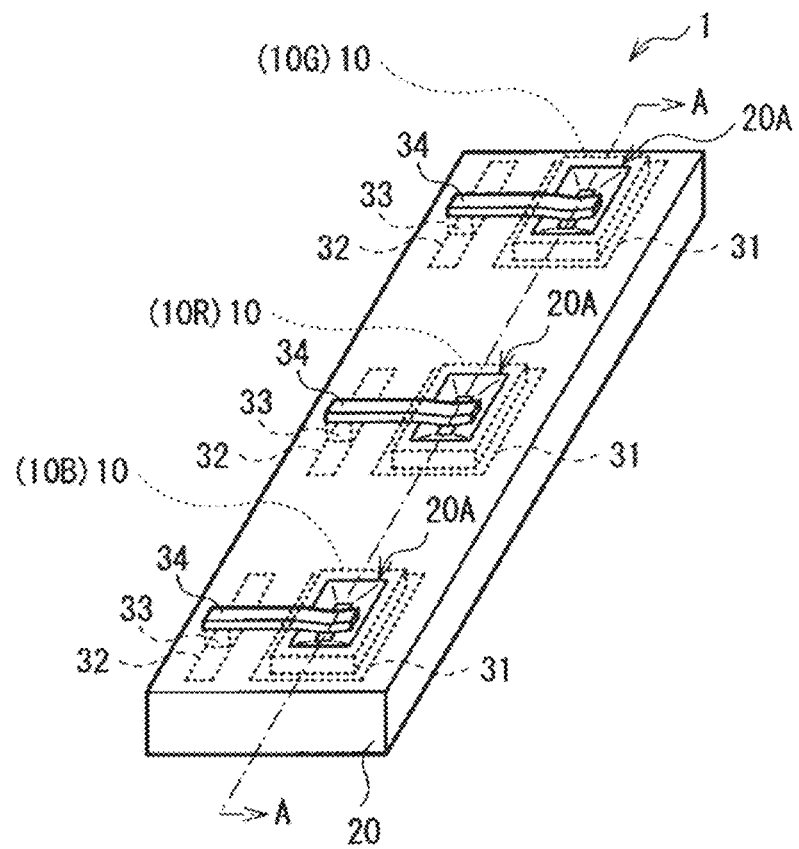
FIG. 1A is a perspective view showing an example of a general configuration of a light-emitting unit.
Figure 1B:
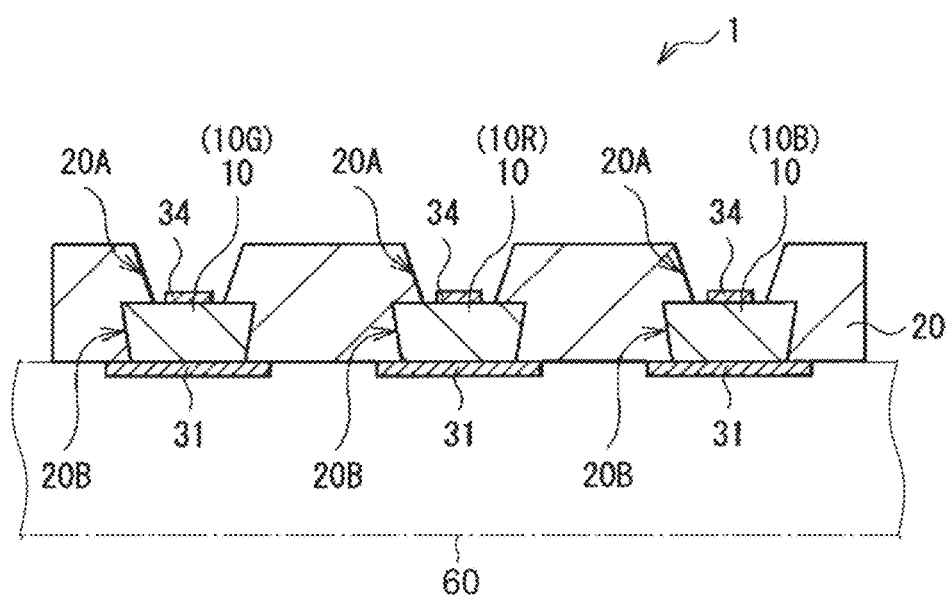
FIG. 1B shows an example of a cross-sectional configuration of the light-emitting unit of FIG. 1A in a direction of the arrow A-A.

FIG. 1A is a perspective view showing an example of a general configuration of a light-emitting unit 1. FIG. 1B shows an example of a cross-sectional configuration of the light-emitting unit 1 of FIG. 1A in a direction of the arrow A-A. The light-emitting unit 1 is suitably applicable as display pixels of a display apparatus, which is a so-called LED display. The light-emitting unit 1 is a small package in which light-emitting devices are covered with a thin resin.

As shown in FIG. 1A, the light-emitting unit 1 includes three light-emitting devices 10, which are semiconductor devices. Each of the light-emitting devices 10 is a solid-state light-emitting device that emits light in a predetermined wavelength range from the top surface thereof and is, specifically, an LED chip. In this specification, the LED chip refers to one cut out from a wafer used for crystal growth and is not of a package type covered with a molded resin or the like.

The LED chip has the size of 5 μm or more and 100 mm or less, for example. The planar shape of the LED chip is substantially a square, for example. The LED chip is in the form of a thin section. An aspect ratio (height/width) of the LED chip is 0.1 or more and less than 1, for example, but is not limited thereto and can be 0.001 or more and less than 10.

The light-emitting devices 10 are disposed within the light-emitting unit 1 and, as shown in FIG. 1A, for example, disposed with predetermined intervals between the light-emitting devices 10. At that time, the light-emitting unit 1 has an elongated shape extending in a direction in which the light-emitting devices 10 are arrayed, for example. A gap between two adjacent light-emitting devices 10 is equal to or larger than the size of each light-emitting device 10, for example. It should be noted that the gap described above may be narrower than the size of each light-emitting device 10 depending on circumstances.

The light-emitting devices 10 emit light in respective different wavelength ranges. For example, as shown in FIG. 1A, the three light-emitting devices 10 are constituted by a light-emitting device 10G that emits light in the green region, a light-emitting device 10R that emits light in the red region, and a light-emitting device 10B that emits light in the blue region.

It should be noted that the positions of the light-emitting devices 10R, 10G, and 10B are not limited to those shown in the figure. Hereinafter, on the assumption that the light-emitting devices 10R, 10G, and 10B are disposed at the positions exemplified above, positional relationships of other constituent elements may be described.

2) Configuration of Light-Emitting Device

Figure 2A:
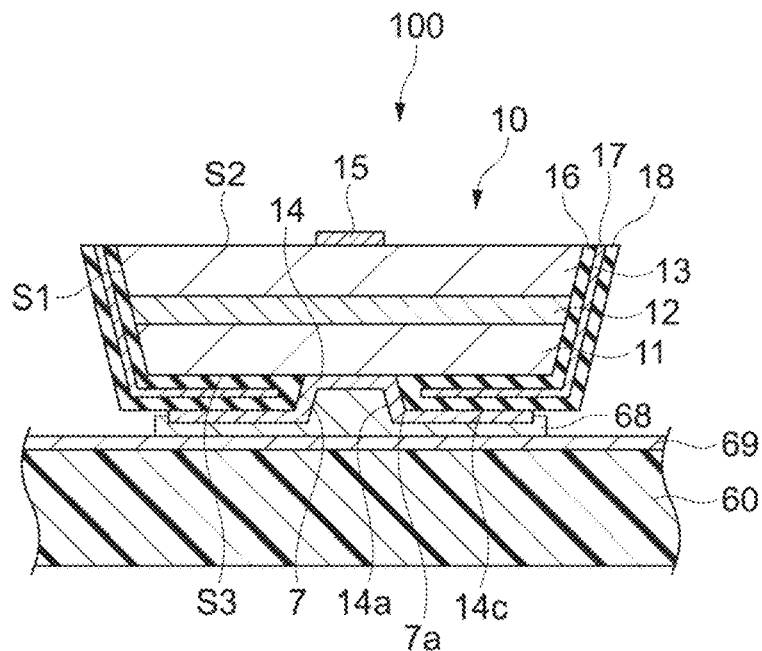
FIG. 2A is a cross-sectional view showing a semiconductor unit including a substrate and light-emitting devices shown in FIGS. 1A and 1B.

FIG. 2A is a cross-sectional view showing a semiconductor unit 100 including a substrate 60 and the light-emitting devices 10 mounted onto the substrate 60. Each of the light-emitting devices 10 includes a semiconductor layer in which a first conductive type layer 11, an active layer 12, and a second conductive type layer 13 are laminated in the stated order from the bottom, for example. The semiconductor layer may include layers different from those above layers.

In the light-emitting devices 10G and 10B, the first conductive type layer 11, the active layer 12, and the second conductive type layer 13 are each constituted by, for example, a gallium nitride-based compound semiconductor, e.g., an InGaN-based semiconductor. On the other hand, in the light-emitting device 10R, the first conductive type layer 11, the active layer 12, and the second conductive type layer 13 are each constituted by, for example, a phosphorus-based compound semiconductor, e.g., an AlGaInP-based semiconductor.

A second electrode 15 is provided on the top surface of the second conductive type layer 13 (i.e., light extraction surface S2). The second electrode 15 is made of, for example, Ti/Pt/Au, in the light-emitting devices 10G and 10B. The second electrode 15 is made of, for example, AuGe (alloy of gold and germanium)/Ni/Au, in the light-emitting device 10R. The second electrode 15 is in contact with the second conductive type layer 13 and is also connected to the second conductive type layer 13, to make an ohmic contact.

A first electrode 14 is provided on the lower surface of the first conductive type layer 11. A part of the first electrode 14 is connected to the first conductive type layer 11 to make an ohmic contact. Hereinafter, the lower surface of the first conductive type layer 11, that is, a lower surface S3 of the semiconductor layer, is described as a "semiconductor-layer lower surface" for the purpose of description. The first electrode 14 is a metal electrode. The first electrode 14 includes a platinum-group element as a main material. Examples of the platinum-group element include Pt, Pd, Ir, Rh, Ru, and Os. The first electrode 14 may be made of an alloy of at least two of those elements.

When the first electrode 14 is made of a single element, the main material thereof is the very element. Further, when the first electrode 14 is made of multiple elements, that is, made of an alloy, the main material thereof is an element having the highest density (wt % or vol %) in those elements. When the first electrode 14 is made of an alloy, it is desirable to include a platinum-group element at the density of 50% or more.

The first electrode 14 and/or the second electrode 15 may be constituted by a single electrode or may be constituted by electrodes physically separated.

The first electrode 14 and the second electrode 15 are formed by, for example, vapor deposition, sputtering, or plating (electrolytic plating or non-electrolytic plating).

A side surface of the semiconductor layer (hereinafter, described as "semiconductor-layer side surface" for the purpose of description) S1 is constituted by the side surfaces of the first conductive type layer 11, the active layer 12, and the second conductive type layer 13. For example, as shown in FIG. 2, the semiconductor-layer side surface S1 is an inclined surface that intersects with a lamination direction. Specifically, the semiconductor-layer side surface S1 is such an inclined surface that the cross section of the light-emitting device 10 has an inverted trapezoid shape (inverted mesa shape). In such a manner, the semiconductor-layer side surface S1 is tapered, and thus light extraction efficiency in a front direction can be enhanced. It should be noted that the semiconductor-layer side surface S1 may be, for example, a surface along the lamination direction, that is, a surface substantially parallel to the lamination direction.

For example, as shown in FIG. 2A, each light-emitting device 10 includes a laminated body including a first insulation layer 16, a metal layer 17, and a second insulation layer 18. The metal layer 17 is disposed between the first insulation layer 16 and the second insulation layer 18.

The laminated body is a layer formed from the semiconductor-layer side surface S1 to the semiconductor-layer lower surface S3 of the semiconductor layer. In the laminated body, at least the first insulation layer 16, the metal layer 17, and the second insulation layer 18 are each a thin layer, and are each formed by thin-film formation processes, for example, CVD (Chemical Vapor Deposition), vapor deposition, and sputtering. Specifically, in the laminated body, at least the first insulation layer 16, the metal layer 17, and the second insulation layer 18 are not formed by a thick-film formation process such as spin coating, resin molding, potting, and the like.

The first insulation layer 16 has a function of electrical insulation from the semiconductor layer. The first insulation layer 16 is provided so as to be in contact with the semiconductor layer and cover the semiconductor layer. The first insulation layer 16 is made of a transparent material with respect to light emitted from the active layer 12, for example, made of $SiO_2$, SiN, $Al_2O_3$, $TiO_2$, or TiN. The first insulation layer 16 has a thickness of, for example, approximately 0.1 µm to 1 µm, which is a substantially uniform thickness. It should be noted that the first insulation layer 16 may have non-uniformity in thickness due to manufacturing errors.

The second insulation layer 18 has a function of protecting the metal layer 17. The second insulation layer is provided so as to cover the metal layer 17. As a material of the second insulation layer 18, the material similar to that of the first insulation layer 16 may be used. The second insulation layer 18 has a thickness of, for example, approximately 0.1 µm to 1 µm, which is a substantially uniform thickness. It should be noted that the second insulation layer 18 may have non-uniformity in thickness due to manufacturing errors.

The second insulation layer 18 may not be provided. The metal layer 17 may be the outermost layer of the light-emitting device 10.

The metal layer 17 has a function of blocking or reflecting light emitted from the active layer 12. The metal layer 17 is provided between the first insulation layer 16 and the second insulation layer 18. The metal layer 17 is made of a material that blocks or reflects the light emitted from the active layer 12, for example, made of Ti, Al, Cu, Au, Ni, a platinum-group-based material, or an alloy of at least two of them. The metal layer 17 has a thickness of, for example, approximately 0.1 µm to 1 µm, which is a substantially uniform thickness. It should be noted that the metal layer 17 may have non-uniformity in thickness due to manufacturing errors.

In the laminated body, at a predetermined position (for example, the center) of a surface of the first insulation layer 16 and the second insulation layer 18, the surface coming into contact with the semiconductor-layer lower surface S3, an aperture 7 is provided. The first electrode 14 includes a concave portion 14a, for example, as a structure formed to be connected to the first conductive type layer 11 via the aperture 7. Further, the first electrode 14 includes an extension portion 14c that extends outward (to the circumference) from an end edge 7a of the aperture 7. In other words, the first electrode 14 is formed such that the concave portion 14a comes into contact with an inner circumferential surface of the aperture 7, and the extension portion 14c comes into contact with the lower surface of the laminated body.

For example, an end portion of the metal layer 17 on the light extraction surface S2 side is formed to be flush with an end portion of the first insulation layer 16 on the light extraction surface S2 side (i.e., flush with the light extraction surface S2). As a result, the end portion of the metal layer 17 is electrically insulated from the second electrode 15. Similarly, the other end portion of the metal layer 17 is also not connected to the first electrode 14, i.e., electrically insulated from the first electrode 14.

It should be noted that, from the viewpoint that the light emitted from the active layer 12 can be prevented from directly entering other light-emitting devices 10, the metal layer 17 only needs to be formed to come into contact with, in the surface of the first insulation layer 16, a surface facing at least the side surface of the active layer 12, and does not necessarily cover portions other than the side surface of the active layer 12. In this case, the first insulation layer 16 only needs to be formed to come into contact with at least the side surface of the active layer 12, in the surface of the semiconductor layer, and does not necessarily cover the entire semiconductor-layer side surface S1.

3) Insulator, Terminal Electrodes

Additionally, as shown in FIG. 1A, the light-emitting unit 1 includes a chip-shaped insulator 20 and terminal electrodes 31 and 32. The insulator 20 covers the light-emitting devices 10. The terminal electrodes 31 and 32 are electrically connected to the light-emitting devices 10. The terminal electrodes 31 and 32 are disposed on the bottom surface side of the insulator 20.

The insulator 20 surrounds and holds the light-emitting devices 10 from at least the side surface side of the light-emitting devices 10. The insulator 20 is made of, for example, a silicone, acrylic, or epoxy resin material.

The insulator 20 is formed to be in contact with side surfaces of each light-emitting device 10 and a region of the top surface of each light-emitting device 10. The insulator 20 has an elongated shape (for example, a rectangular parallelepiped shape) extending in a direction in which the light-emitting devices 10 are arrayed. The height of the insulator 20 is larger than the height of each light-emitting device 10, and the horizontal width of the insulator 20 (width in a short-side direction) is larger than the width of each light-emitting device 10. The size of the insulator 20 is, for example, 1 mm or less.

For example, as shown in FIGS. 1A and 1B, the insulator 20 includes apertures 20A at positions corresponding to the respective light-emitting devices 10 immediately thereabove. On the bottom surface of each of the apertures 20A, at least the second electrode 15 (not shown in FIGS. 1A and 1B) is exposed. Further, the insulator 20 also includes apertures 20B at positions corresponding to the respective light-emitting devices 10 immediately therebelow, for example. On the bottom surface of each of the apertures 20B, the first electrode 14 (not shown in FIGS. 1A and 1B) is exposed.

The terminal electrode 31 functions as part of metal wiring of the substrate 60 shown in FIG. 2A. The second electrode 15 is connected to the terminal electrode 32 via a bump 33 and a connection portion 34 shown in FIG. 1A. The bump 33 is a columnar conductive member that is embedded in the insulator 20. The connection portion 34 is a band-like conductive member that is formed on the top surface of the insulator 20.

As shown in FIG. 2A, the semiconductor unit 100 includes a plating layer 68 that bonds the substrate 60 and the light-emitting devices 10. Specifically, the plating layer 68 is provided between the above-mentioned wiring 69 provided on the substrate 60 and the first electrode 14, and is connected thereto for electrical conduction. Typically, the plating layer 68 is made of Cu. For example, the plating layer 68 is made of Cu, Au, Ni, Pd, Cr, Zn, Sn, Pt, Ag, Cd, or an alloy of at least two of them.

The platinum-group element such as Pd may be used as a material of the plating layer 68. In this case, the first electrode 14 and the plating layer 68 each include the platinum-group element as a main material. The main material of the first electrode 14 and the material of the plating layer 68 may be the same element.

The plating layer 68 is formed by electrolytic plating, for example, but may be formed by non-electrolytic plating depending on combinations of the materials of the plating layer 68 and the first electrode 14.

In the semiconductor unit 100 shown in FIG. 2A, the plating layer 68 is formed to be filled into the concave portion 14a of the first electrode 14, for example. By adjustment of a plating processing time, the material for plating is filled into the concave portion 14a.

Figure 2B:
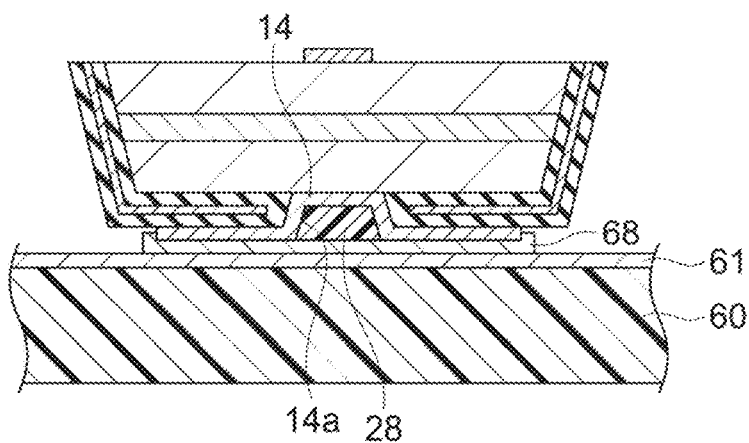
FIGS. 2B and 2C are cross-sectional views each showing a semiconductor unit according to another configuration example.

However, as shown in FIG. 2B, the plating layer 68 may not be filled into the concave portion 14a of the first electrode 14, whereas a resin 28 may be filled thereinto. Typical examples of the material of the resin 28 include a photo-curable resin, which is formed as a temporary fixing portion by a cell alignment method in the manufacturing process shown in FIG. 1 of Japanese Patent Application Laid-open No. 2011-233733. In the configuration example shown in FIG. 2B, the plating layer 68 is connected to the extension portion 14c of the first electrode 14.

Figure 2C:
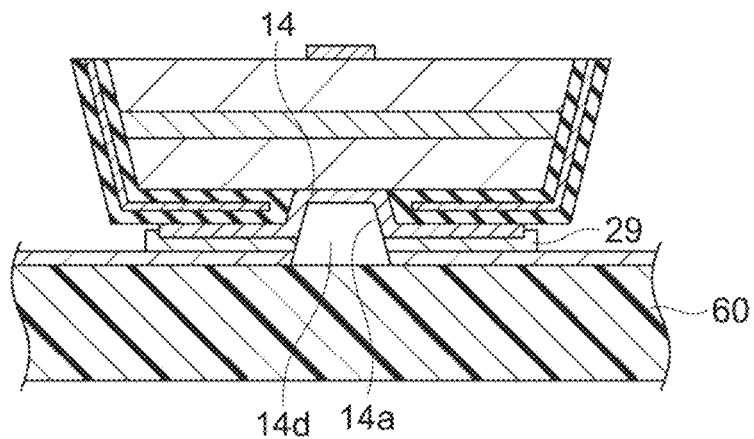

Alternatively, as shown in FIG. 2C, the inside of the concave portion 14a of the first electrode 14 may be a cavity 14d. In the case of the semiconductor unit shown in FIG. 2C, there is no metal material for wiring immediately below the concave portion 14a of the first electrode 14, and due to the manufacturing process, the wiring (terminal electrode) has a shape having a hole at the center thereof.

2. Configuration Example 2 of Light-Emitting Unit

Next, another configuration example of the light-emitting unit will be described. Description on configurations and functions of this light-emitting unit and light-emitting devices that are similar to those of the light-emitting unit 1 will be omitted or simplified.

1) Configuration of Light-Emitting Unit

Figure 3A:
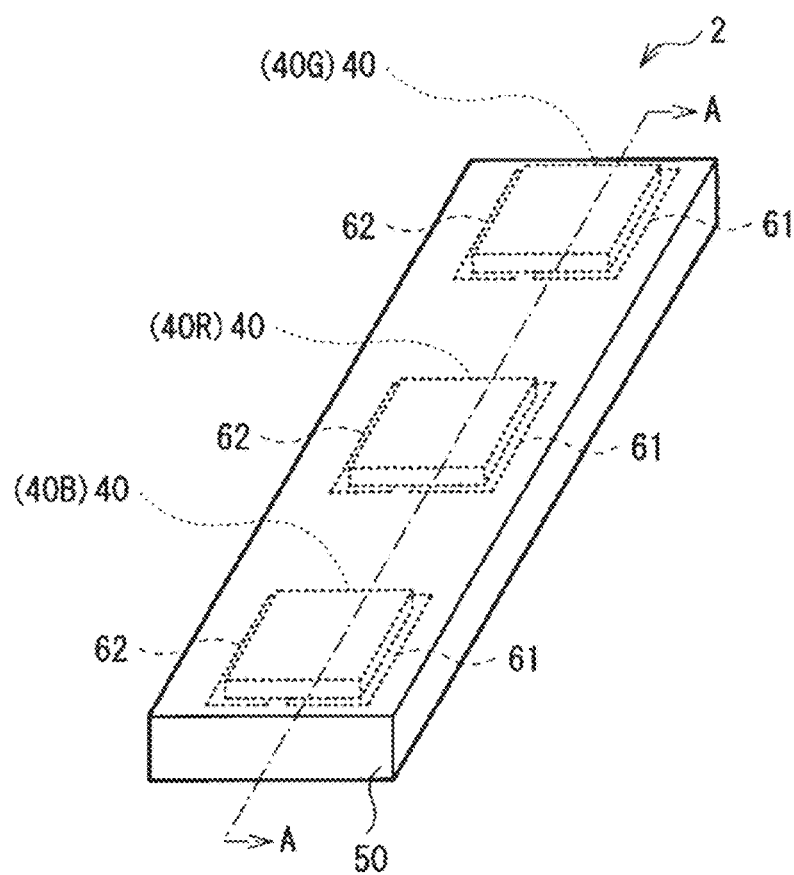
FIG. 3A is a perspective view showing an example of a general configuration of another light-emitting unit.
Figure 3B:
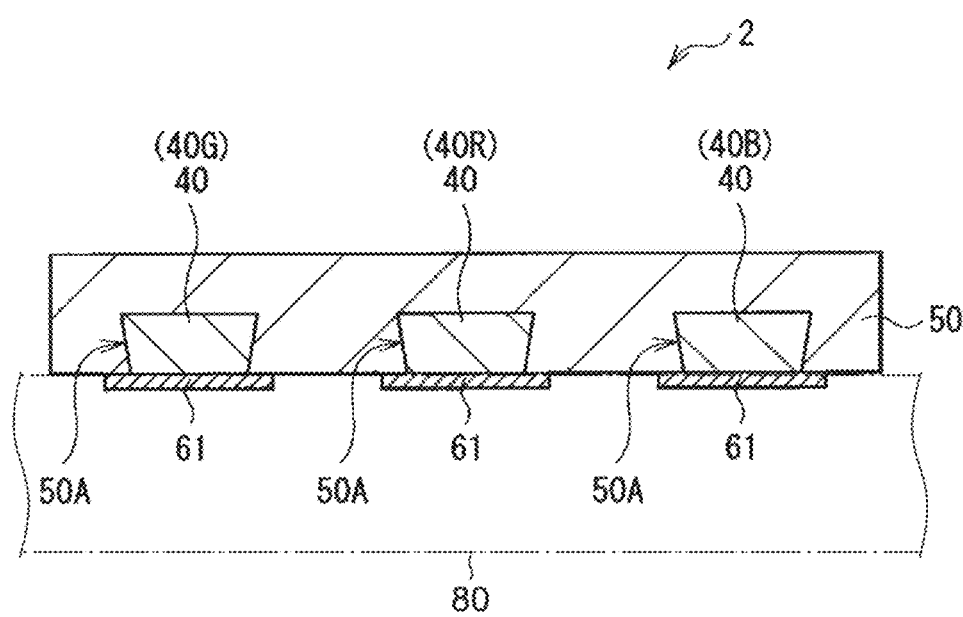
FIG. 3B shows an example of a cross-sectional configuration of the light-emitting unit of FIG. 3A in a direction of the arrow A-A.

FIG. 3A is a perspective view showing an example of a general configuration of a light-emitting unit 2. FIG. 3B shows an example of a cross-sectional configuration of the light-emitting unit 2 of FIG. 3A in a direction of the arrow A-A.

The light-emitting unit 2 includes an insulator 50 of a rectangular parallelepiped shape. The insulator 50 includes apertures 50A that house respective light-emitting devices 40R, 40G, and 40B. The light-emitting devices 10 described above are each of both-side electrode type in which the first electrode 14 and the second electrode 15 are disposed above and below the light-emitting device 10. In contrast to this, the light-emitting devices 40 are each of one-side electrode type in which a first electrode 44 and a second electrode 45 (see FIG. 4) are included on the lower side (on the substrate 80 side) only.

FIG. 3B does not show those first electrode 44 and second electrode 45. Those first electrode 44 and second electrode 45 are connected to terminal electrodes 61 and 62 as part of wiring or the like on the substrate 80.

2) Configuration of Light-Emitting Device

Figure 4:
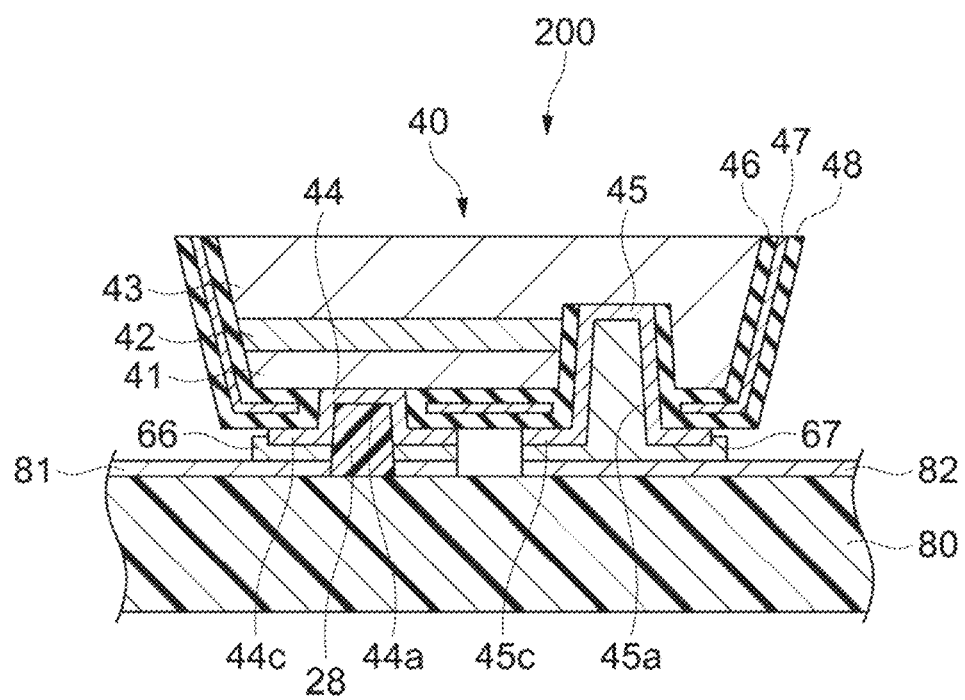
FIG. 4 shows an example of a cross-sectional configuration of a substrate and a light-emitting device shown in FIGS. 3A and 3B.

FIG. 4 shows an example of a cross-sectional configuration of a semiconductor unit 200 including the light-emitting devices 40. Each of the light-emitting devices 40 includes a semiconductor layer including a first conductive type layer 41, an active layer 42, and a second conductive type layer 43. Further, each of the light-emitting devices 40 includes the first electrode 44 and the second electrode 45. Further, each of the light-emitting devices 40 includes a laminated body including a first insulation layer 46, a metal layer 47, and a second insulation layer 48.

The first electrode 44 includes a concave portion 44a and an extension portion 44c. Similarly, the second electrode 45 includes a concave portion 45a and an extension portion 45c. Each extension portion 44c is formed to be flush with the lower surface of the second insulation layer 48.

The concave portion 45a of the second electrode 45 is formed to be deeper than the concave portion 44a of the first electrode 44. A part of the first insulation layer 46 is provided to have an aperture shape in the circumference of the concave portion 45a of the second electrode 45, and the second electrode 45 is connected to the second conductive type layer 43 via the aperture.

The first electrode 44 and the second electrode 45 each include a platinum-group element as a main material. The platinum-group element of the first electrode 44 and the platinum-group element of the second electrode 45 may be the same or different.

Inside the concave portion 44a of the first electrode 44, a resin 28 formed in the manufacturing process remains. The first electrode 44 and the second electrode 45 are connected to wiring 81 and wiring 82 (for example, terminal electrodes 61 and 62) on the substrate 80 via plating layers 66 and 67, respectively. The material of the plating layer 67 is filled into the concave portion 45a of the second electrode 45.

Figure 5A:
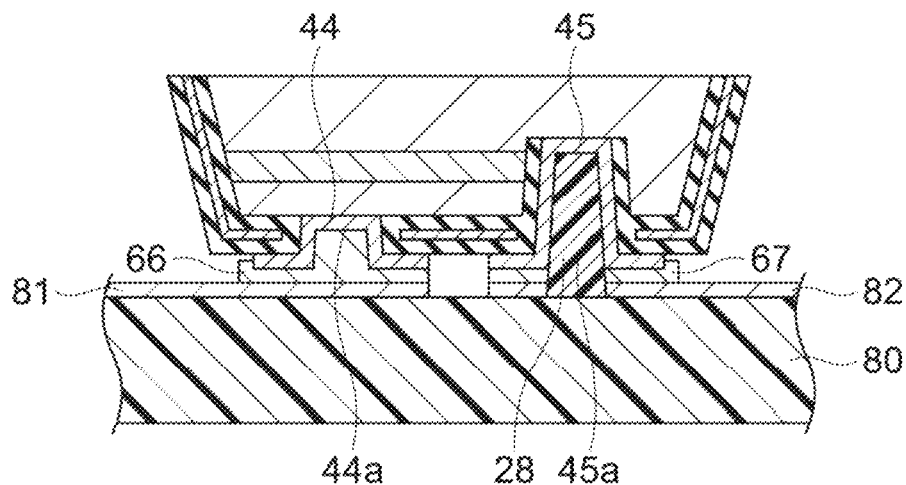
FIGS. 5A to 5C each show a cross section of another configuration of the light-emitting device of FIG. 4.
Figure 5B:
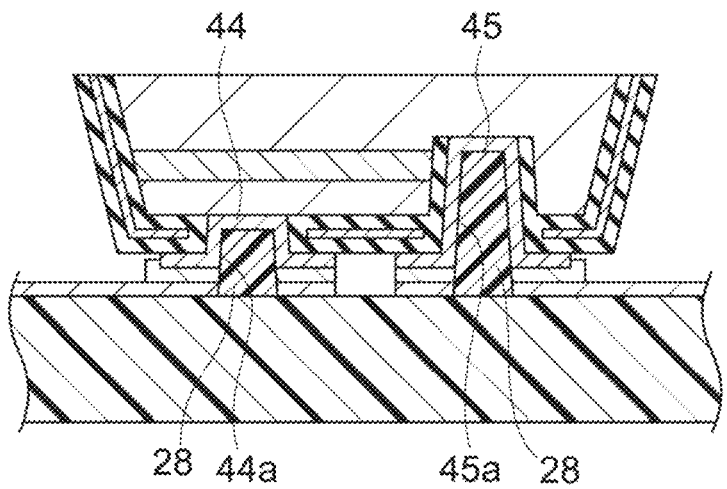
Figure 5C:
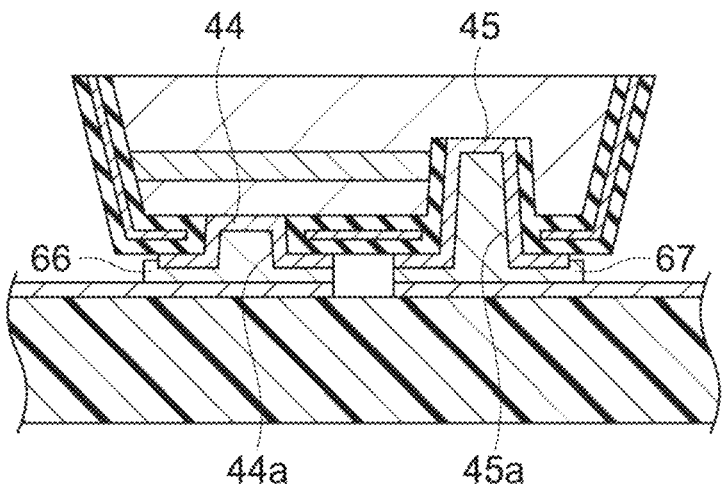

FIGS. 5A to 5C each show a cross section of another configuration of the light-emitting device.

In the light-emitting device shown in FIG. 5A, the material of the plating layer 66 is filled into the concave portion 44a of the first electrode 44. The resin 28 is filled into the concave portion 45a of the second electrode 45. In the light-emitting device shown in FIG. 5B, the resin 28 is filled into the concave portions 44a and 45a. In the light-emitting device shown in FIG. 5C, the material of the plating layers 66 and 67 is filled into the concave portions 44a and 45a. It should be noted that in the light-emitting devices of FIGS. 4 and 5A to 5C, a cavity may be provided into the concave portion 44a instead of a resin material, as shown in FIG. 2C, for example.

3. Regarding Adhesiveness Among Substrate, Light-Emitting Device, and (Electrode and Plating Layer)

1) Reason why Adhesiveness Between Platinum-Group Element and Plating Layer is High Next, adhesiveness between the electrodes 14, 44, and 45 and the plating layers 66, 67, and 68 will be described. As described above, in the light-emitting device 10 according to the configuration example 1, the first electrode 14 is mainly made of a platinum-group element. In the light-emitting device 40 according to the configuration example 2, the first electrode 44 and the second electrode 45 are each mainly made of a platinum-group element. In such a manner, the platinum-group element is used for the electrode. Thus, adhesiveness between the electrode and the plating layer is increased, and bonding strength thereof can be enhanced.

Three reasons why adhesiveness between the platinum-group element and the plating layer is high are as follows.

[1] An oxide film is difficult to form on the platinum-group element.

[2] Ionization tendency of the platinum-group element is larger than that of Au (metal more basic than Au).

[3] The platinum-group element is a hydrogen adsorption metal.

A noble metal (platinum-group element) such as Pt tends to have low ionization tendency, which is difficult to oxidize, similarly to Au. A material having high ionization tendency tends to be difficult to cause plating growth. Since the ionization tendency of the noble metal such as Pt is higher than that of Au, the noble metal such as Pt has a direction easier to cause plating growth than Au and, simultaneously, is difficult to oxidize due to hydrogen bonding strength, which is estimated from a special surface hydrogen adsorption function. In other words, due to the three reasons described above, it is thought that a function of ease of plating bonding operates in the noble metal such as Pt, and excellent plating bonding is performed.

The order of ionization tendency is as follows.

K>Ca>Na>Mg>Al>Zn>Fe>Ni>Sn>Pb>(H)>Cu>Hg>Ag>Pt>Au

For a cathode catalytic activity of plating, metal-hydrogen bonding is important. In non-electrolytic plating or the like, it is also necessary that a metal as a target to form the plating layer 68 include hydrogen and thus the hydrogen be easy to separate. In the case of electrolytic plating, since disassociation of each bonding is electrically caused, also when a metal having a large degree of hydrogen adsorption is included in the cathode, plating growth can be caused. Thus, it is thought that coupling (bonding) strength can be more increased. Pt, Pd, Rh, or the like has a function as a hydrogen adsorption and absorption metal, and the effects thereof are also applied to the present technology.

Figure 6:
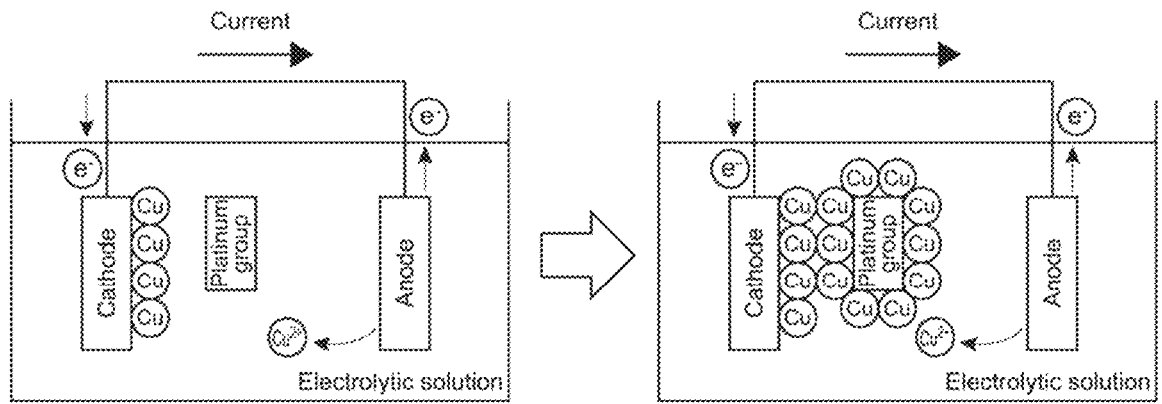
FIG. 6 is a diagram schematically showing the principle of electrolytic plating by Cu on a platinum-group element.

FIG. 6 is a diagram schematically showing the principle of the electrolytic plating by Cu on the platinum-group element. As shown in the left part of FIG. 6, an anode made of Cu loses electrons, and copper ions are generated in an electrolytic solution. The cathode receives the electrons and forms Cu around the cathode. As shown in the right part of FIG. 6, after Cu formed in the cathode comes into contact with a platinum-group element material provided in the vicinity of the cathode, the copper ions and the electrons are supplied to the surface of the platinum-group element material as well, and Cu is increasingly formed.

Figure 7:
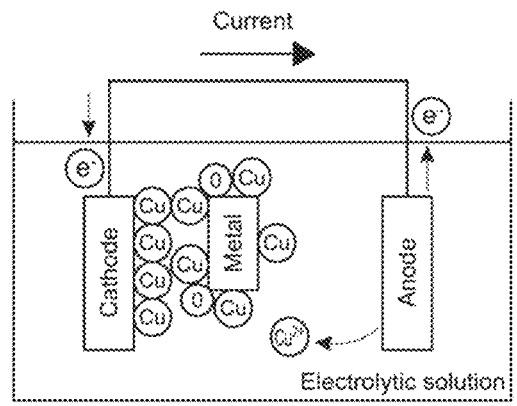
FIG. 7 is a diagram schematically showing the principle of the electrolytic plating by Cu on a metal easier to oxidize than the platinum-group element.

FIG. 7 is a diagram schematically showing the principle of the electrolytic plating by Cu on a metal easier to oxidize than the platinum-group element. In such a manner, compared with a case where many impurities such as oxide films are found on the metal surface, a uniform plating layer 68 is formed on the surface of the platinum-group element material shown in FIG. 6.

2) Peel Test

The inventors of the present technology performed a peel test (an evaluation test for adhesiveness) of a Cu plating layer with respect to three types of metals on the substrate.

Figure 8C:
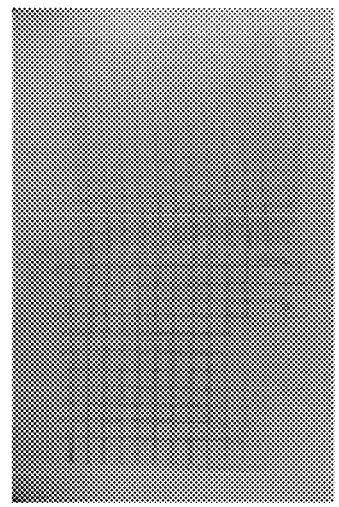
FIGS. 8A, 8B, and 8C are photographs showing results of an evaluation test for adhesiveness between three types of metals and a plating layer.
Figure 8B:
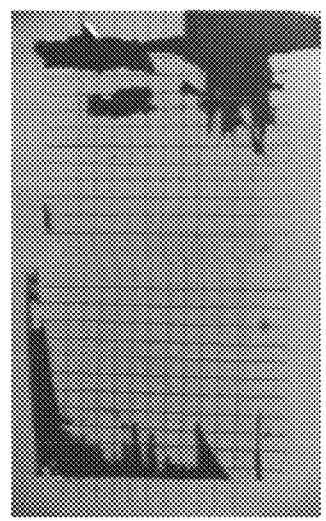
Figure 8A:
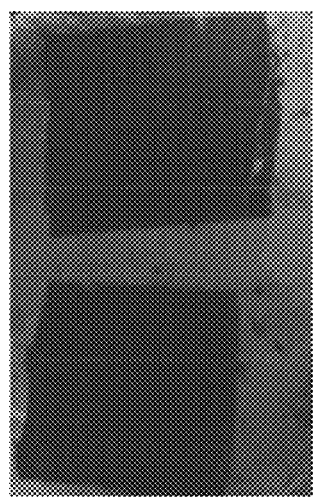

FIGS. 8A, 8B, and 8C are photographs showing results of the peel test of the three types of metals and the plating layer. Ti is used as metal in FIG. 8A, Au in FIG. 8B, and Pt in FIG. 8C. From those experiments, results are obtained in which adhesiveness of the Cu plating layer on Pt is the highest as shown in FIG. 8C. Using the evaluation standards for adhesiveness, which are adopted in the semiconductor manufacturing industry, the highest result, 5B, was obtained on a six-point scale of 0B to 5B.

3) Relationship Between Area of Lower Surface (Bottom Surface) of Light-Emitting Device and Area of Bonding Surface of Plating Layer Next, description will be given on an area ratio of a bonding surface of the electrode and the plating layer in plan view to the lower surface of the light-emitting device 10 or 40 according to the configuration example 1 or 2 (hereinafter, described as "bonding area ratio" for the purpose of description). For example, as shown in FIG. 9A, a lower surface 40A of the light-emitting device 40 is the lower surface of the laminated body (second insulation layer 18 or 48 therein), i.e., the surface facing the substrate 80.

3-1) One-Side-Electrode-Type Light-Emitting Device

Figure 9A:
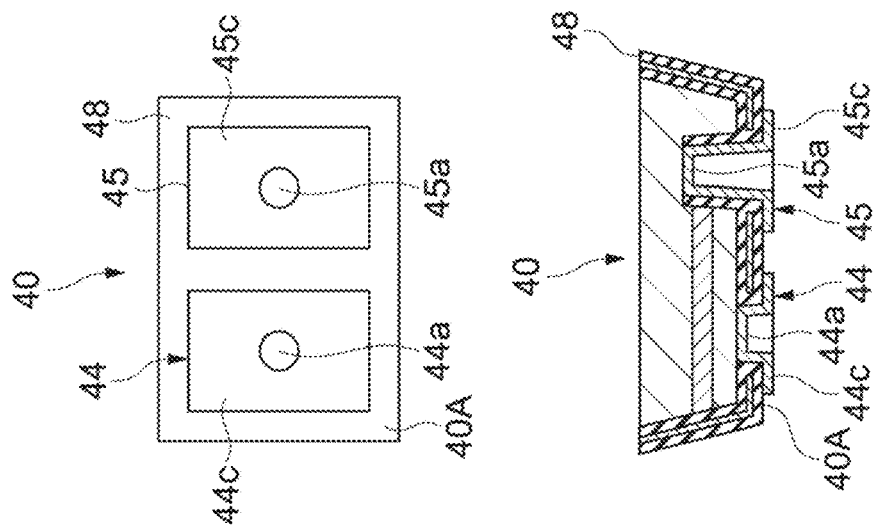
FIGS. 9A to 9C sequentially show the processes of forming the plating layers.
Figure 9B:
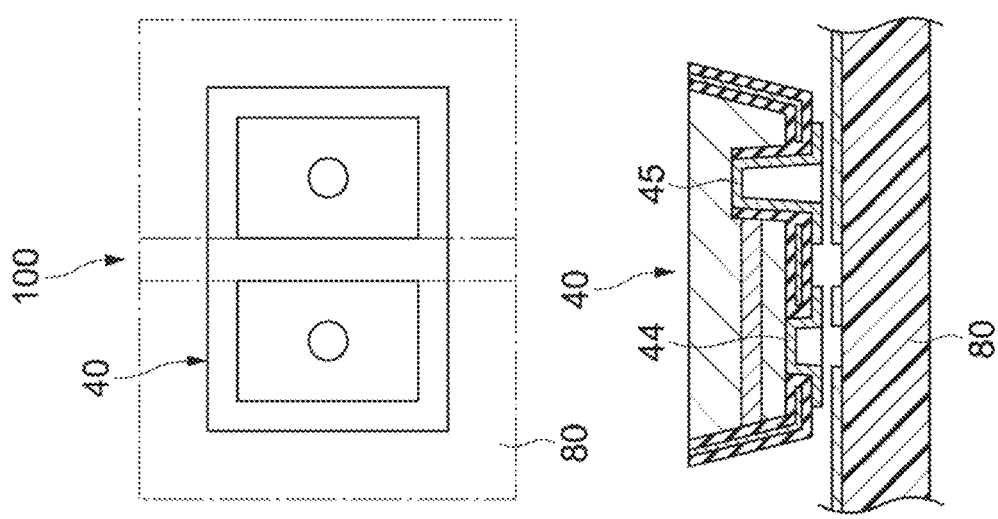
Figure 9C:
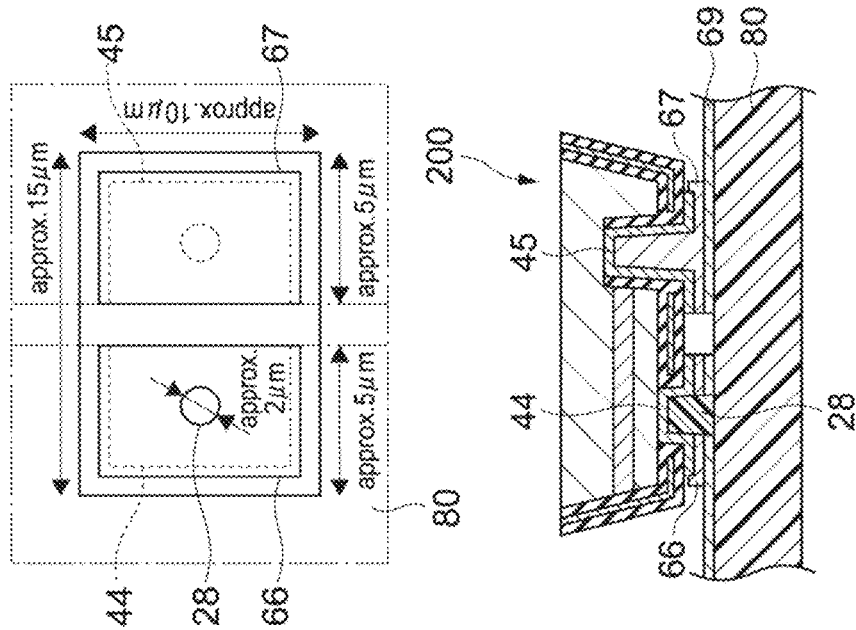

FIGS. 9A to 9C sequentially show the processes of forming the plating layers 66 and 67. The upper diagrams of FIGS. 9A to 9C are plan views seen from the lower side of the one-side electrode type light-emitting device 40, i.e., from the substrate 80 side, according to the configuration example 2. As shown in FIGS. 9A and 9B, the light-emitting device and the substrate 80 are aligned, and as shown in FIG. 9C, the plating layers 66 and 67 are formed between the first and second electrodes 44 and 45 and the substrate 80 by an electrolytic plating method.

For example, in the process between FIGS. 9B and 9C, for example, as disclosed in Japanese Patent Application Laid-open No. 2011-233733, the resin 28 is formed in the circumference of or under the light-emitting device 40 by the self-alignment method. As a result, as shown in FIG. 4, for example, the semiconductor unit 200 including the light-emitting devices, in each of which the resin 28 is filled into the concave portion 44a of the first electrode 44, is manufactured (FIG. 9C).

In the semiconductor unit 200, examples of the size of the light-emitting device 40 are as follows (see FIG. 9C).

An area of the lower surface 40A of the light-emitting device 40: approximately 15 μm×10 μm=approximately 150 μm$^2$ A total area of the plating bonding surface of the first electrode 44 and the second electrode 45: approximately 78 μm$^2$ Therefore, the bonding area ratio is: 78/150=approximately 52%.

Further, an equivalent diameter corresponding to the area of the resin 28 or the cavity in the concave portion 44a of the first electrode 44 is approximately 2 μm. Specifically, the area of that circle is approximately 3 μm$^2$.

Figure 10A:
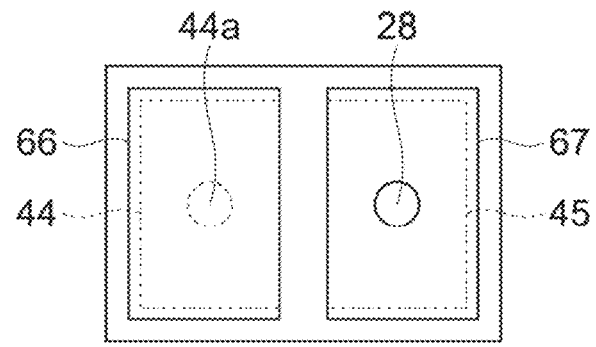
FIGS. 10A to 10C are plan views showing the lower surface side of the light-emitting devices shown in FIGS. 5A to 5C, respectively.
Figure 10B:
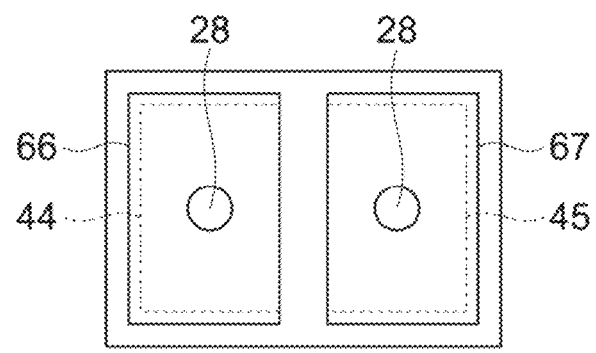
Figure 10C:
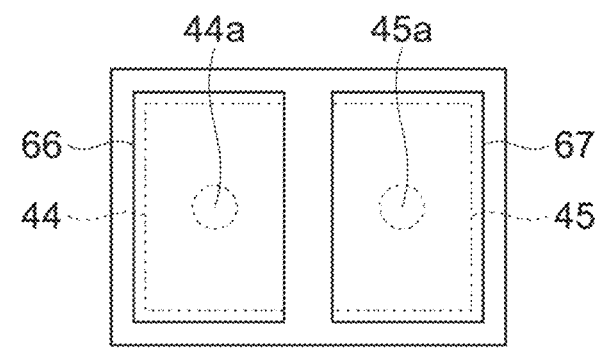

FIGS. 10A to 10C are plan views showing the lower surface side of the light-emitting devices shown in FIGS. 5A to 5C, respectively. In the same manner as the method of calculating the bonding area ratio in the light-emitting device 40, the ratios of the areas of the lower surfaces of the light-emitting devices shown in FIGS. 5A to 5C to the area of the plating bonding surface are obtained. The results are as follows.

A bonding area ratio of the light-emitting device shown in FIG. 5A (FIG. 10A): approximately 50%

A bonding area ratio of the light-emitting device shown in FIG. 5B (FIG. 10B): approximately 52%

A bonding area ratio of the light-emitting device shown in FIG. 5C (FIG. 10C): approximately 54%

Figure 11:
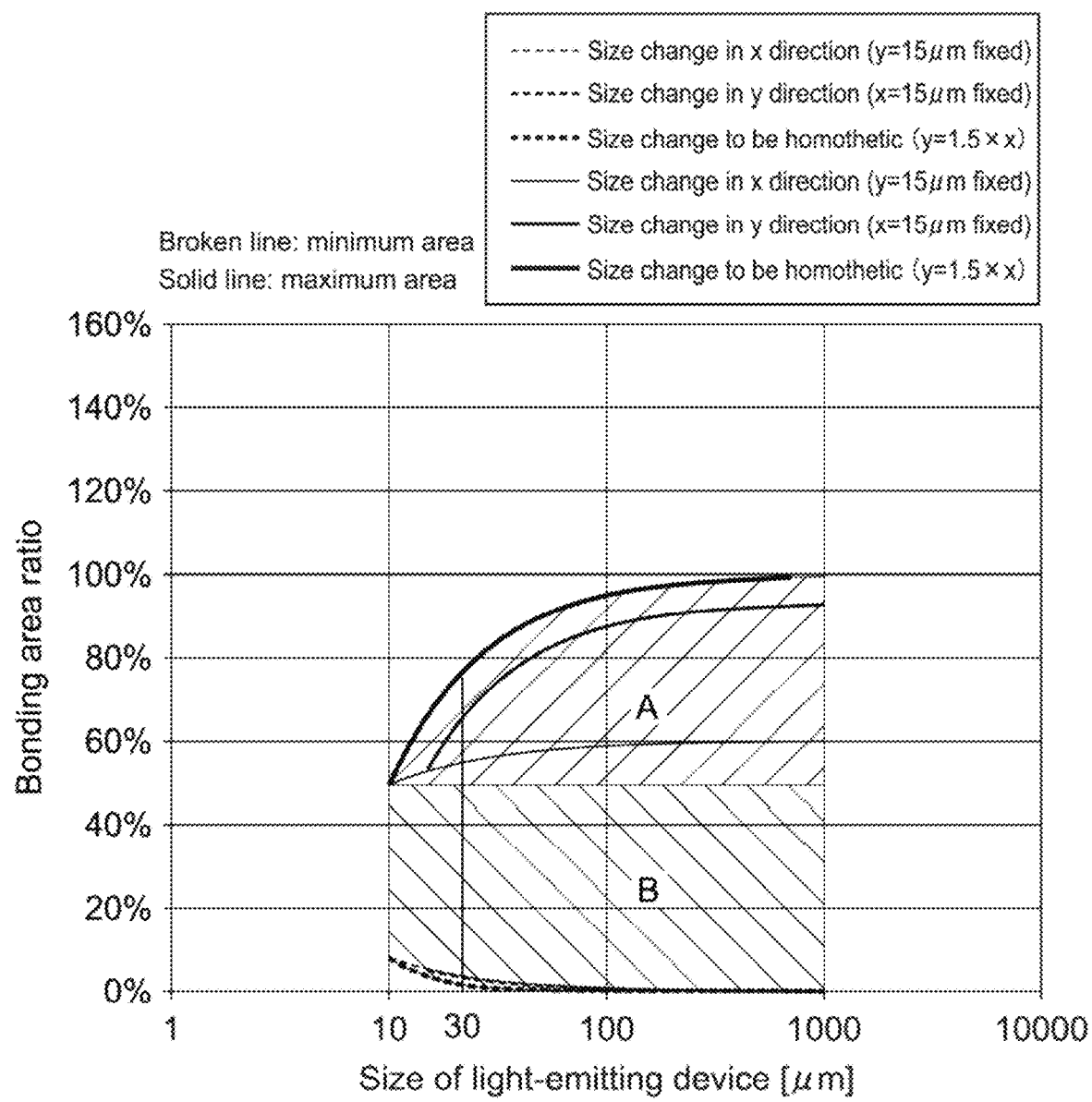
FIG. 11 is a graph showing a relationship between the size of a one-side-electrode-type light-emitting device or the like (horizontal axis) and a bonding area ratio (vertical axis).
Figure 11:
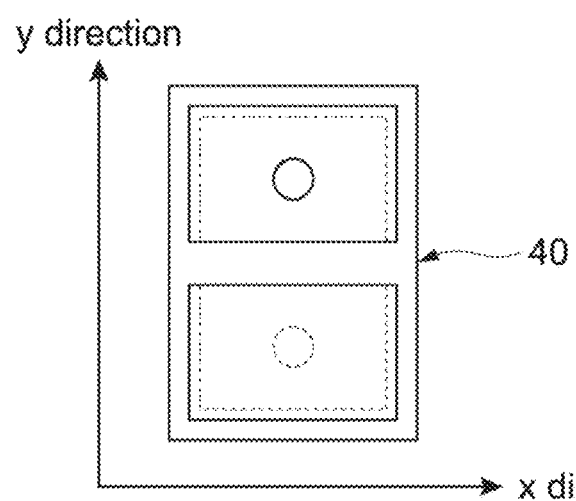

The upper part of FIG. 11 is a graph showing a relationship between the size of the one-side electrode type light-emitting device 40 or the like (horizontal axis) and a bonding area ratio (vertical axis). In this graph, as shown in the lower part of FIG. 11, a short-side direction of the lower surface of the light-emitting device is defined as x direction, and a longitudinal direction thereof as y direction. The determination of the size of the light-emitting device is classified into the following three patterns.

a) A case where the size in the x direction, for example, is fixed and the size in the y direction is changed.

b) A case where the size in the y direction is fixed, and the size in the x direction is changed.

c) A case where the size in both the x and y directions are changed (homothetic).

The broken lines each represent the minimum bonding area ratio, and the solid lines each represent the maximum bonding area ratio.

A region A shown in FIG. 11 is a range capable of maintaining excellent adhesiveness. However, since a region B has a low bonding area ratio, reduction in adhesiveness is anticipated.

In the graph of FIG. 11, in the light-emitting device having the size of approximately 10 μm to 30 μm, the maximum bonding area ratio is 50% or more and 85% or less. In the light-emitting device having the size of approximately 10 μm, the bonding area ratio is approximately 50%, which is desirably set to the allowable minimum bonding area ratio.

3-2) Both-Side-Electrode-Type Light-Emitting Device

Figures 12A, 12B:
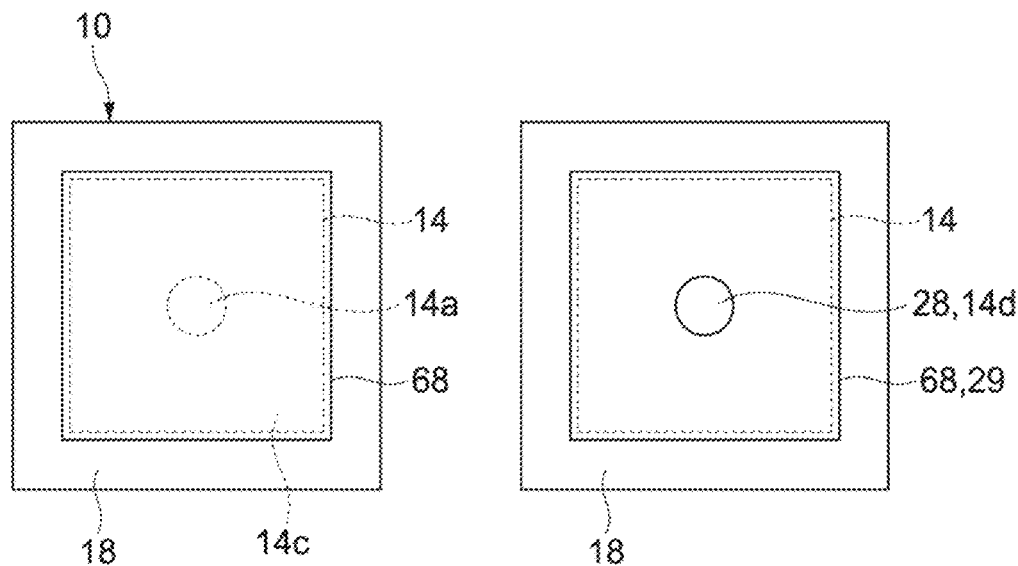
FIG. 12A is a plan view showing the lower surface side of a both-side-electrode-type light-emitting device shown in FIG. 2A.
FIG. 12B is a plan view showing the lower surface side of a both-side-electrode-type light-emitting device shown in FIG. 2B or 2C.

FIG. 12A is a plan view showing the lower surface side of the both-side electrode type light-emitting device 10 shown in FIG. 2A. FIG. 12B is a plan view showing the lower surface side of the both-side-electrode-type light-emitting device shown in FIG. 2B or 2C.

The size of the lower surfaces of those light-emitting devices is:

approximately 10 μm×10 μm=approximately 100 μm².

The size of the first electrode 14 is:

approximately 9 μm×9 μm=approximately 81 μm².

Therefore, the bonding area ratio is as follows.

A bonding area ratio of the light-emitting device shown in FIG. 2A (FIG. 12A): 78%

A bonding area ratio of the light-emitting device shown in FIG. 2B or C (FIG. 12B): 81%

Figure 13:
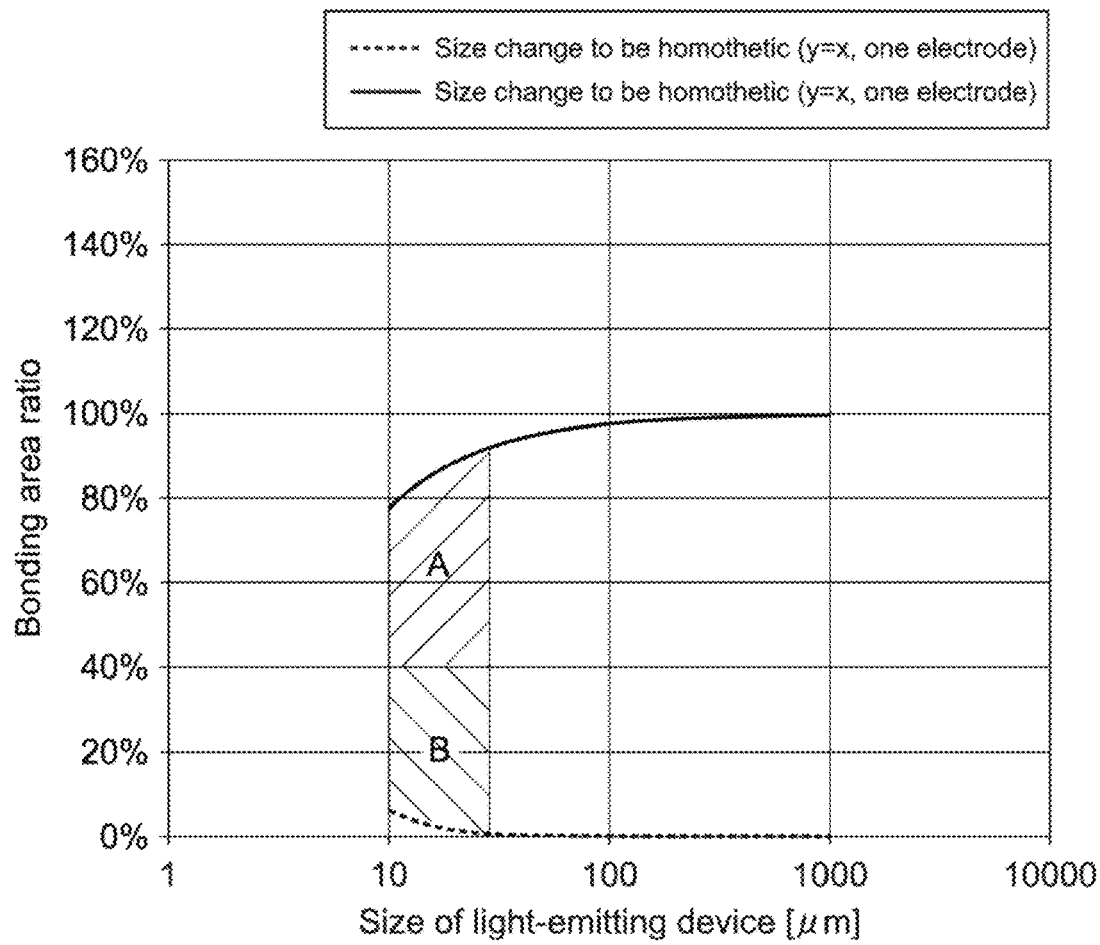
FIG. 13 is a graph showing a relationship between the size of the both-side-electrode-type light-emitting device or the like (horizontal axis) and a bonding area ratio (vertical axis).

FIG. 13 is a graph showing a relationship between the size of the both-side electrode type light-emitting device 10 or the like (horizontal axis) and a bonding area ratio (vertical axis). In the light-emitting device 10 having the size of approximately 10 μm to 30 μm, a region A is a range capable of maintaining excellent adhesiveness. Similarly to the one-side-electrode-type light-emitting device, it is desirable to set the minimum bonding area ratio to approximately 50%.

4. Conclusion

As described above, since the electrodes 14, 44, and 45 each including the platinum-group element as a main material are bonded to the substrates 60 and 80 by the plating layers 67 and 68, adhesiveness between the electrodes and the plating layers is increased, and bonding strength thereof can be enhanced.

For example, as shown in FIGS. 2A, 4, 5A, and 5C, the plating layer grows into the concave portions 14a, 44a, and 45a of the electrodes, so that a bonding area of the electrode and the plating layer can be increased. As a result, adhesiveness can be enhanced.

A difference in coefficient of thermal expansion between the electrode and the plating layer is smaller than a difference in coefficient of thermal expansion between the electrode and the resin or a cavity. Due to the small difference in coefficient of thermal expansion, even under the circumstances of heat generation from the semiconductor device and the like, there is no possibility that the electrode and the plating layer are broken and thus the semiconductor device is peeled off from the substrate. Thus, high reliability can be ensured.

However, even when the resin 28 is filled into the concave portion 14a, 44a, or 45a of the electrode or even when the concave portion 14a, 44a, or 45a is a cavity, as described above, the bonding area ratio of approximately 50% or more is ensured as a design of the light-emitting device. Thus, there are no problems of the breakage described above and the adhesiveness.

In addition, among the platinum-group elements, for example, Pt and Rh have a light reflectance in the violet to blue wavelength range, and the reflectance is higher than that of Au and Ti. Pt has the reflectance of approximately 52%, and Rh has the reflectance of approximately 78%. In contrast to this, Au has the reflectance of approximately 38%. In other words, the light-emitting devices 10 and 40 and the like are used as devices to emit light having the blue wavelength range, so that light use efficiency can be enhanced.

5. Method of Manufacturing Semiconductor Unit

Figure 14A:
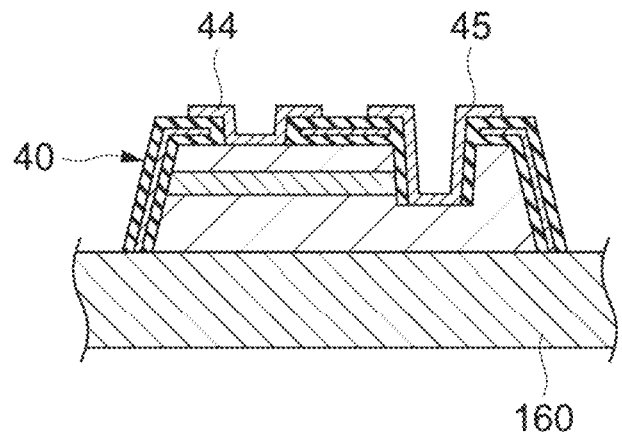
FIGS. 14A and 14B sequentially show the processes of manufacturing a semiconductor unit including the one-side-electrode-type light-emitting devices, for example.
Figure 14B:
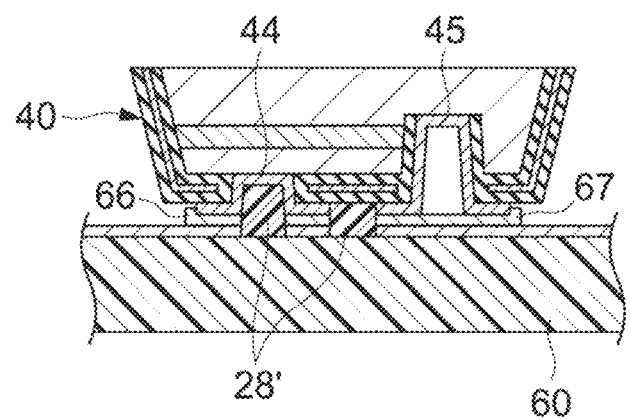

1) Method of Manufacturing Semiconductor Unit 200 According to the Present Technology FIGS. 14A and 14B are diagrams sequentially showing the processes of manufacturing the semiconductor unit 200 including the one-side electrode type light-emitting devices 40, for example. Here, description will be given on a process subsequent to the process of transferring the semiconductor device onto a transfer substrate to expose electrodes.

As shown in FIG. 14A, the semiconductor device 40 is transferred onto a transfer substrate 160 from the light extraction surface S2 side, and thus the first electrode 44 and the second electrode 45 are exposed. Here, even if the first electrode 44 and the second electrode 45 are exposed, those electrodes are platinum-group elements and thus hardly oxidized.

Subsequently, the semiconductor device 40 is removed from the transfer substrate 160 and positioned with the exposed side of the first and second electrodes 44 and 45 facing a mount substrate (substrate 60). As shown in FIG. 14B, in a state where temporary fixing portions 28', which are formed by curing predetermined regions of a photo-curable resin, are left, the plating layers 67 and 68 are formed between the electrodes 44 and 45 and the substrate 60. For example, plating growth is performed until the plating layer 67 is filled into the concave portion 45a of the second electrode 45.

2) Method of Manufacturing Semiconductor Unit According to Comparative Example

Figure 15A:
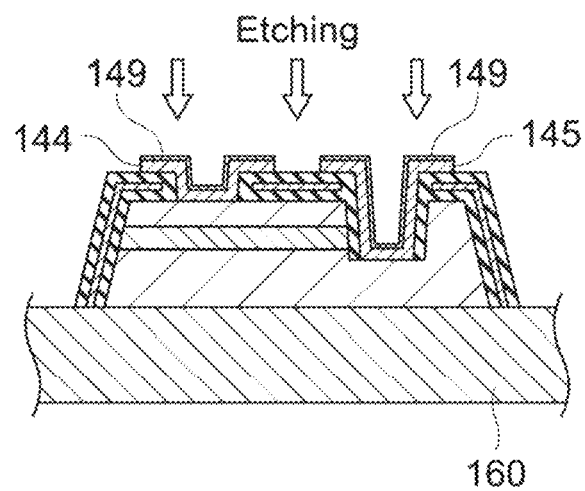
FIGS. 15A to 15C sequentially show the processes of manufacturing a semiconductor unit according to a comparative example.
Figure 15B:
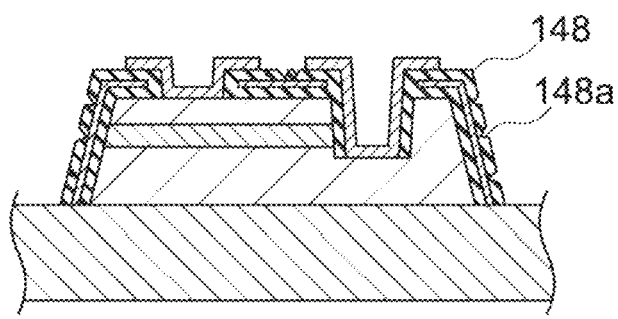
Figure 15C:
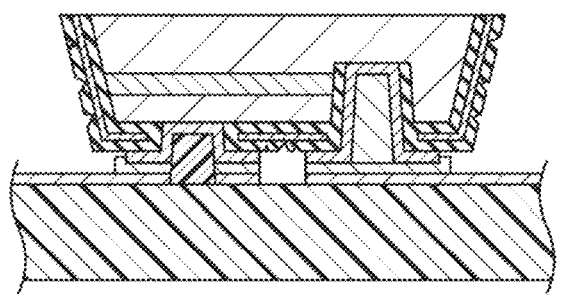

FIGS. 15A to 15C are diagrams sequentially showing the processes of manufacturing a semiconductor unit according to a comparative example. In the manufacturing processes, a difference from FIGS. 14A and 14B is that in FIG. 15A the surfaces of exposed electrodes (which are not of platinum-group elements) 144 and 145 may be oxidized, and thus it is necessary to provide a process of removing an oxide film 149 thereof by etching.

In other words, in the processes of manufacturing the semiconductor unit according to the present technology shown in FIGS. 14A and 14B, it is unnecessary to perform the process of removing the oxide film shown in FIG. 15A. As a result, it is possible to shorten the manufacturing time and reduce manufacturing costs.

Further, in the semiconductor device shown in FIG. 15B, there is a possibility that due to the etching process in FIG. 15A, cuts 148a of an insulation layer 148 formed on the outer circumferential portion are generated. However, according to the processes of FIG. 14 according to the present technology, it is unnecessary to perform the process of removing the oxide film as described above. Thus, the cuts as described above are lessened.

6. Light-Emitting Apparatus (Lighting Apparatus, Display Apparatus, Etc.)

1) Configuration of Light-Emitting Apparatus

The light-emitting devices are mounted onto the substrate 60 so as to be disposed in an n-by-m (n and m are integers of 2 or more) matrix of light-emitting devices, so that a "light-emitting panel" is achieved. The light-emitting panel is, for example, a lighting panel or an image display panel. In particular, the light-emitting units 1 shown in FIGS. 1A and 1B are mounted onto the substrate 60 so as to be disposed in the n-by-m (n and m are integers of 2 or more) matrix thereof, so that a full-color image display panel is achieved.

As described above, the "light-emitting apparatus" including a lighting panel or a display panel includes a driver circuit that drives those light-emitting devices. The light-emitting apparatus including the lighting panel is a "lighting apparatus". The light-emitting apparatus including the display panel is a "display apparatus". Hereinafter, a display apparatus including a display panel will be exemplified as the light-emitting apparatus.

1-1) Configuration of Display Panel

Figure 16:
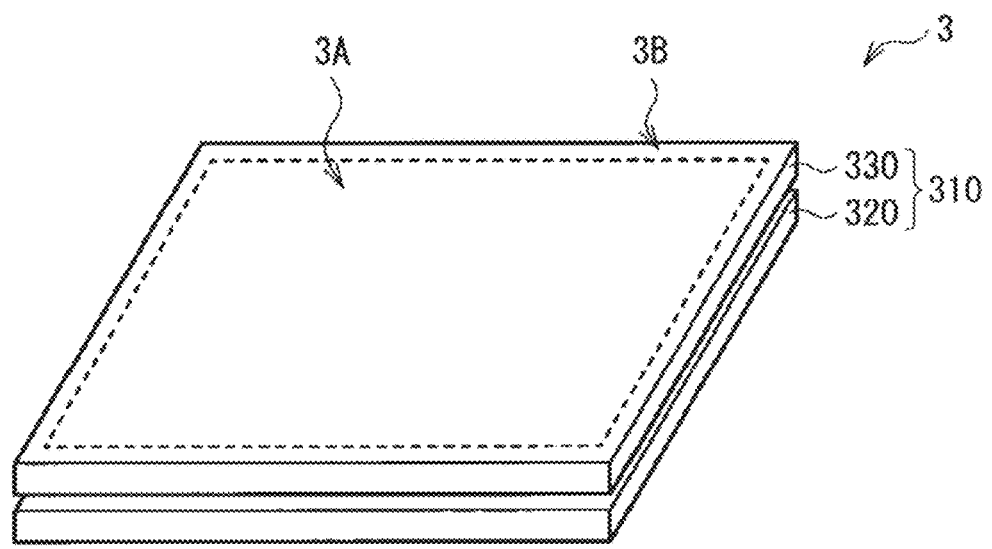
FIG. 16 is a schematic perspective view of a display apparatus according to one embodiment.

FIG. 16 is a schematic perspective view of such a display apparatus 3. The display apparatus 3 includes the light-emitting units 1 and the like according to the above embodiment as display pixels. The display apparatus 3 includes, for example, a display panel 310 and a driver circuit (Pixel IC) (not shown) that drives the display panel 310 (light-emitting units thereof).

The display panel 310 is constituted by superimposing a mount substrate 320 (above-mentioned substrate 60 or 80 etc.) and a transparent substrate 330 on each other. The surface of the transparent substrate 330 is a video display screen. The transparent substrate 330 has a display region 3A at the center portion and a frame region 3B in the circumference of the display region 3A. The frame region 3B is a non-display region.

1-2) Mount Substrate

Figure 17:
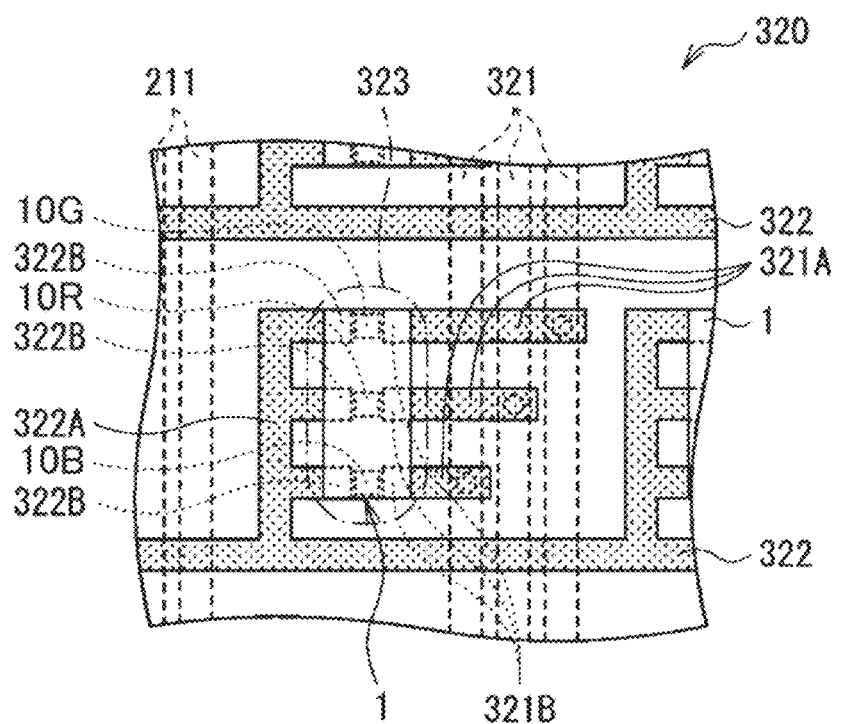
FIG. 17 shows an example of the layout of a region, which corresponds to a display region, in a surface of a mount substrate on the transparent substrate side.

FIG. 17 shows an example of a layout of a region, which corresponds to the display region 3A, in a surface of the mount substrate 320 on the transparent substrate 330 side. In the region corresponding to the display region 3A in the surface of the mount substrate 320, for example, data wires 321 are formed to extend in a predetermined direction and disposed parallel to each other at predetermined pitches. Further, in the region corresponding to the display region 3A in the surface of the mount substrate 320, for example, scanning wires 322 are formed to extend in a direction intersecting with (for example, orthogonal to) the data wires 321 and disposed parallel to each other at predetermined pitches.

The scanning wires 322 are formed on the outermost surface, for example, and formed on an insulation layer (not shown) formed on a substrate surface, for example. It should be noted that the base material of the mount substrate 320 is made of, for example, a glass substrate or a resin substrate, and the insulation layer on the base material is made of, for example, SiN, $SiO_2$, or $Al_2O_3$. Meanwhile, the data wires 321 are formed within a layer different from the outermost layer including the scanning wires 322 (for example, a layer lower than the outermost layer), for example, formed within the insulation layer on the base material. On the surface of the insulation layer, for example, a black is provided as necessary in addition to the scanning wires 322.

Display pixels 323 are located in the vicinity of the intersections of the data wires 321 and the scanning wires 322. The display pixels 323 are disposed in a matrix in the display region 3A. In each of the display pixels 323, the light-emitting unit 1 (or light-emitting unit 2) including the light-emitting devices (light-emitting devices shown in FIGS. 2B and 2C, or light-emitting devices shown in FIGS. 4 and 5A to 5C) is mounted.

In the light-emitting unit 1, the pair of terminal electrodes 31 and 32 described above is provided in each of the light-emitting devices 10R, 10G, and 10B. One of the electrodes, the terminal electrode 31, is electrically connected to the data wire 321, and the other terminal electrode 32 is electrically connected to the scanning wire 322. For example, the terminal electrode 31 is electrically connected to a pad electrode 321B at the tip of a branch 321A provided to the data wire 321. Further, for example, the terminal electrode 32 is electrically connected to a pad electrode 322B at the tip of a branch 322A provided to the scanning wire 322.

The pad electrodes 321B and 322B are formed on the outermost surface, for example, and provided at a position at which each light-emitting unit 1 and the like are mounted as shown in FIG. 17, for example. The pad electrodes 321B and 322B herein correspond to the wiring or electrodes of the substrates 60 and 80 of the embodiments described above.

The mount substrate 320 is further provided with, for example, support columns (not shown) that regulate a gap between the mount substrate 320 and the transparent substrate 330. The support columns may be provided within a region facing the display region 3A or a region facing the frame region 3B.

7. Other Various Embodiments

The present technology is not limited to the embodiments described above and can achieve other various embodiments.

In the light-emitting device 10, the first electrode 14 includes the platinum-group element as a main material. If the second electrode 15 is connected to a plating layer, the second electrode 15 may also include a platinum-group element as a main material, similarly to the first electrode 14.

In order to increase a bonding area of the electrode and the plating layer, irregularities are formed on the surface of the electrode, for example. Thus, surface roughness thereof may be set to be large.

For example, an embedded layer made of a resin material may be provided around the second insulation layer 48 of the light-emitting device 40 or the like according to the configuration example 2 described above.

As in the present technology, the technology in which an electrode including a platinum-group element as a main material is connected to a substrate via a plating layer may be applied to a driver circuit that drives the light-emitting units provided to the display panel of the display apparatus described above. In this case, the terminal electrode of an IC chip as a semiconductor device includes the platinum-group element as a main material, and the IC chip is connected to the substrate via the plating layer.

Alternatively, the present technology is not limited to the display apparatus as described above. The present technology also includes an embodiment in which a platinum-group element as a main material is applied to electrodes of semiconductor devices incorporated into various electric apparatuses, and those electrodes are connected to a substrate via a plating layer.

In each of the embodiments, the electrode includes a concave portion, and the concave portion is connected to the first conductive type layer or the second conductive type layer. However, the electrode only needs to have a shape connected via the aperture of the insulation layer, and may have a structure close to a concave portion or a structure that is not a concave portion. The structure close to a concave portion is, for example, a structure in which the depth of the concave portion is very shallow. The structure that is not a concave portion is a structure in which the electrode material, for example, a portion having the shape of a projection, bump, circular plate, or the like, is filled into the aperture of an insulation film.

Of the features of the embodiments described above, at least two of the features can be combined.

It should be noted that the present technology can have the following configurations.

(1) A semiconductor unit, including:
a substrate;
a semiconductor device that includes a semiconductor layer and one or more electrodes, the one or more electrodes being connected to the semiconductor layer and including a platinum-group element as a main material; and
a plating layer that bonds the substrate and the electrode.

(2) The semiconductor unit according to (1), in which
the semiconductor device further includes an insulation layer, the insulation layer being provided to come into contact with the semiconductor layer and including an aperture, and
the electrode has a structure that is formed to come into contact with the insulation layer and to be connected to the semiconductor layer via the aperture.

(3) The semiconductor unit according to (2), in which
the electrode includes an extension portion that extends outward from an end edge of the aperture, and
the plating layer is connected to at least the extension portion of the electrode.

(4) The semiconductor unit according to (3), in which
the plating layer is further provided in a region of the electrode within the aperture.

(5) The semiconductor unit according to any one of (2) to (4), in which
the semiconductor layer includes an active layer, a first conductive type layer, and a second conductive type layer, and
the one or more electrodes include a first electrode, the first electrode being connected to at least the first conductive type layer.

(6) The semiconductor unit according to (5), in which
the one or more electrodes further include a second electrode, the second electrode being connected to the second conductive type layer.

(7) The semiconductor unit according to (5) or (6), in which
the insulation layer includes a surface that faces the substrate, and
a ratio of an area of a bonding surface of the electrode and the plating layer to an area of the surface is 50% or more and 85% or less.

(8) A semiconductor device, including:
a semiconductor layer;
one or more electrodes that are connected to the semiconductor layer and include a platinum-group element as a main material; and
a plating layer that is bonded to the electrode.

(9) A light-emitting apparatus, including:
a light-emitting panel; and
a driver circuit that drives the light-emitting panel, the light-emitting panel including
a substrate,
light-emitting devices each including a semiconductor layer and one or more electrodes, the one or more electrodes being connected to the semiconductor layer and including a platinum-group element as a main material, and
a plating layer that bonds the substrate and the electrodes of the light-emitting devices.

(10) A display apparatus, including:
light-emitting units each including light-emitting devices as one pixel and including light-emitting units on a pixel-by-pixel basis, the light-emitting devices emitting light of different wavelength ranges; and
a driver circuit that drives the light-emitting units, the driver circuit including
a substrate,
a semiconductor device that includes a semiconductor layer and one or more electrodes, the one or more electrodes being connected to the semiconductor layer and including a platinum-group element as a main material, and
a plating layer that bonds the substrate and the electrode.

(11) A method of manufacturing a semiconductor unit, including:
exposing an electrode, the electrode being connected to a semiconductor layer and including a platinum-group element as a main material;
causing the exposed electrode to face a mount substrate; and
forming a plating layer between the electrode and the mount substrate.

DESCRIPTION OF SYMBOLS 1, 2 light-emitting unit
3 display apparatus
10 (10R, 10G, 10B), 40 (40R, 40G, 40B) light-emitting device (semiconductor device)
11, 41 first conductive type layer
12, 42 active layer
13, 43 second conductive type layer
14, 44 first electrode
14d cavity
14a, 44a, 45a concave portion
14c, 44c, 45c extension portion
15, 45 second electrode
16, 46 first insulation layer
17, 47 metal layer
18, 48 second insulation layer
60, 80, 320 substrate
66, 67, 68 plating layer
69, 81, 82 wiring
100, 200 semiconductor unit

The invention claimed is:
1. A semiconductor unit, comprising:
a substrate;
a semiconductor device that includes:
a semiconductor layer, wherein the semiconductor layer includes a first conductive layer and a second conductive layer,
an insulation layer,
a first electrode, wherein
the first electrode includes a platinum-group element as a main material,
the first electrode is connected to at least the first conductive layer, and
the first electrode includes a first concave portion, a second electrode, wherein
the second electrode is connected to the second conductive layer,
the second electrode includes a second concave portion, and
a depth of the second concave portion is greater than a depth of first concave portion; and
a plating layer between the substrate and the first electrode, wherein
the plating layer is below the first electrode, and
the first electrode is between the insulation layer and the plating layer.

2. The semiconductor unit according to claim 1, wherein
the insulation layer is in contact with the semiconductor layer,
the insulation layer includes an aperture, and
the first electrode is in contact with the insulation layer and the semiconductor layer via the aperture.

3. The semiconductor unit according to claim 2, wherein
the first electrode includes an extension portion that extends outward from an end edge of the aperture, and
the plating layer is connected to at least the extension portion of the first electrode.

4. The semiconductor unit according to claim 3, wherein
the plating layer is in a region of the first electrode, and
the region of the first electrode is within the aperture.

5. The semiconductor unit according to claim 2, wherein
the semiconductor layer further includes an active layer.

6. The semiconductor unit according to claim 5, wherein
the insulation layer further includes a surface that faces the substrate, and
a ratio of an area of a bonding surface of the first electrode and the plating layer to an area of the surface that faces the substrate is 50% or more and 85% or less.

7. A semiconductor device, comprising:
a semiconductor layer, wherein the semiconductor layer includes a first conductive layer and a second conductive layer;
an insulation layer;
a first electrode, wherein
the first electrode is connected to at least the first conductive layer,
the first electrode includes a platinum-group element as a main material, and
the first electrode includes a first concave portion; a second electrode, wherein
the second electrode is connected to the second conductive layer,
the second electrode includes a second concave portion, and
a depth of the second concave portion is greater that a depth of the first concave portion; and
a plating layer in contact with the first electrode, wherein
the plating layer is below the first electrode, and
the first electrode is between the insulation layer and the plating layer.

8. A light-emitting apparatus, comprising:
a light-emitting panel; and
a driver circuit configured to drive the light-emitting panel, wherein the light-emitting panel includes:
a substrate,
a plurality of light-emitting devices, wherein each of the plurality of light-emitting devices includes:
a semiconductor layer, wherein the semiconductor layer includes a first conductive layer and a second conductive layer,
an insulation layer,
a first electrode, wherein
the first electrode is connected to at least the first conductive layer,
the first electrode includes a platinum-group element as a main material, and
the first electrode includes a first concave portion,
a second electrode, wherein
the second electrode is connected to the second conductive layer,
the second electrode includes a second concave portion, and
a depth of the second concave portion is greater than a depth of the first concave portion, and
a plating layer between the substrate and the first electrode, wherein,
the plating layer is below the first electrode, and
the first electrode is between the insulation layer and the plating layer.

9. A method of manufacturing a semiconductor unit, comprising:
exposing a first electrode, wherein
the first electrode is connected to at least a first conductive layer of a semiconductor layer and an insulation layer;
the semiconductor layer includes the first conductive layer and a second conductive layer,
the first electrode includes a platinum-group element as a main material, and
the first electrode includes a first concave portion;
exposing a second electrode, wherein
the second electrode is connected to the second conductive layer,
the second electrode includes a second concave portion, and
a depth of the second concave portion is greater than a depth of the first concave portion;
causing the exposed first electrode and the exposed second electrode to face a mount substrate; and
forming a plating layer between the first electrode and the mount substrate, wherein
the plating layer is below the first electrode, and
the second electrode is between the insulation layer and the plating layer.

* * * * *